(12) United States Patent
Towler et al.

(10) Patent No.: US 6,373,738 B1
(45) Date of Patent: Apr. 16, 2002

(54) LOW POWER CAM MATCH LINE CIRCUIT

(75) Inventors: Fred J. Towler, Essex; Reid A. Wistort, Westford, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/716,511

(22) Filed: Nov. 20, 2000

(51) Int. Cl.[7] ............................................. G11C 15/00
(52) U.S. Cl. ................................... 365/49; 365/189.07
(58) Field of Search ............................. 365/49, 189.07, 365/189.01

(56) References Cited

U.S. PATENT DOCUMENTS

| 4,694,425 A | 9/1987 | Imel |
| 5,267,213 A | 11/1993 | Sung et al. |
| 5,317,201 A | 5/1994 | Takayanagi |
| 5,396,449 A | 3/1995 | Atallah et al. |
| 5,452,243 A | 9/1995 | Ansel et al. |
| 5,617,348 A | 4/1997 | Maguire |
| 5,689,454 A | 11/1997 | Patwa |
| 5,740,097 A | 4/1998 | Satoh |
| 6,128,207 A | * 10/2000 | Lien et al. ............... 365/49 |

FOREIGN PATENT DOCUMENTS

JP  11073783  3/1999

OTHER PUBLICATIONS

IBM Technical Disclosure Bulletin—Encoder/Resolver Array for Content Addressable Memory; vol. 17, No. 3, Aug. 1974; pp. 855–858.

* cited by examiner

*Primary Examiner*—Hoai V. Ho
(74) *Attorney, Agent, or Firm*—Schmeiser, Olsen & Watts; Steven Capella

(57) ABSTRACT

A Match-Detection Circuit and Match-Detection method, for low-power-consuming searches in a Content Addressable Memory. A HIT is output when the Match Line rises from a Low voltage level to a higher Match Detection Voltage. The Match Detection Voltage is approximately the conducting threshold voltage of an N-channel Field Effect Transistor (FET), and is normally less than One Half of the Power Supply Voltage. Circuits and methods to turn of the through-current in each MISS-ing entry by a carefully timed control signal at the end of a brief Match Detection Period, are disclosed.

16 Claims, 12 Drawing Sheets

FIG. 3Cii ization of the binary word storable in each entry) increases, the capacitance of each Match Line generally

LOW POWER CAM MATCH LINE CIRCUIT

BACKGROUND OF THE INVENTION

1. Technical Field

The invention relates generally to content addressable memory (CAM) devices, and more specifically, to the design and use of Match-Detecting Match Line Controller circuitry for CAMs.

2. Related Art

A Content Addressable Memory (CAM) is a device adapted to perform fast (e.g., single-clock cycle) searches of list based data stored in a plurality of locations called entries.

As depicted in FIG. 1, a CAM cell 101 differs from a Random Access Memory (RAM) storage cell in that a CAM cell adds a comparison logic circuit to every memory cell, to provide the content-addressable functionality. Unlike RAM arrays, all data words in the word storage locations (i.e., entries) of a CAM array may be simultaneously compared with a search word (i.e., comparand) stored in a comparand buffer. This added functionality generally raises the component count in each cell by the number of transistors or other components/circuit elements needed to perform the comparison function, but adds a "parallel processing" characteristic to the CAM memory array. Many CAM arrays generally include a plurality of pass-transistors (e.g., $PT_j$ in FIG. 1A, where j=1, 2, . . . X) connected in parallel and connected between a Match Line and ground, to form a distributed Match Line Pass-Gate.

The CAM Match Line Pass-Gate is a distributed pass-gate comprised of the plurality of parallel Pass-Transistors or a plurality of parallel Pass-Transistor-Stacks which are connected to the Match Line. A CAM cell may comprise a pair of Pass-Transistor-Stacks that together perform a logical XNOR comparison function within the CAM cell. A Pass-Transistor-Stack may be comprised of 2 or more transistors connected in series between the Match Line and ground, forming a leg of the Match Line Pass-Gate. Each leg of the Match Line Pass-Gate may be comprised of NFETs or PFETs or a combination of these types of Field Effect Transistors (FET).

In most CAM circuits of the related art, as in FIG. 1, the Match Line functions as a capacitor having capacitance ($C_{ML}$) that is pre-charged (e.g., through pre-charge transistor $T_{PC}$) to a logic High voltage (e.g., Vdd) prior to each search, and the observable event on each Match Line will be a MISS (the logical opposite of a MATCH which is also called a HIT), which will cause the Match Line voltage to drop (discharge towards ground voltage) from the pre-charged High voltage to a Low voltage through the Match Line Pass-Gate.

In the case of a MATCH-ing entry, the Match-Line pass-gate (i.e., comprised of all of the pass-transistor stacks connected in parallel to the Match Line) of the MATCH-ing entry will remain OFF (i.e., non-conducting). Therefore, the pre-charged Match Line of a MATCH-ing entry will remain High in the MISS-detecting CAM circuits (e.g., 102 in FIG. 1) of the related art. Thus, in the related art, the Match-sensing hardware designer is faced with the problem of detecting the lack of a Match Line voltage change, which includes challenges in defining reliable strobing protocols and sensing margins necessary to activate a reliable MATCH or HIT output signal.

In the Match Line systems of the related art, as the size (i.e., width X) of the binary word storable in each entry increases, the capacitance of each Match Line generally increases proportionately. Because the energy consumed ($E_{CAP}$) by the complete discharge of a capacitor (e.g., a Match Line) is equal to ½CVcap², where C is the capacitance and $V_{cap}$ is the Voltage across the capacitor, the energy consumed per search by each MISS (e.g., $E_{MISS}=E_{CAP}$) with this Match Line system can increase approximately proportionally with the increased size (X) of the word storable in the CAM entry. Additionally, the energy consumed by most of the CAM circuits of the related art is directly proportional to the frequency of searches, and therefore the Power consumed and heat generated during operation of the Miss-detecting CAM circuits (e.g., 102 of FIG. 1a) of the related art generally increases with increasing search frequency.

Although some attempt is made in the related art to minimize the energy lost upon each Miss event in each search, e.g., by minimizing the Match Line Capacitance $C_{ML}$, or by preventing the Match Line from completely discharging the entire pre-charged voltage (e.g., $V_{cap}$), these methods still generally fail to prevent the energy consumed in each MISS from increasing in proportion with increasing size (i.e., width X) of words in each entry and with increasing frequency of searches.

A different approach, a Match-event detection approach, is disclosed in the 1999 Japanese Patent No. JP11073783, issued to Yoshiaki, wherein each Match Line in the disclosed CAM is precharged Low (e.g., at or near ground), and raises above a Match Detection Voltage ($V_{MD}$) only upon the occurrence of a MATCH of all bits in the entire entry associated with that Match Line. The Yoshiaki patent teaches that a CMOS Inverter (19) (presumably comprising a PFET transistor stacked upon an NFET transistor) driven directly and only by the Match Line voltage ($V_{ML}$) is to be used to detect the occurrence of a MATCH-event on the Match Line of a MATCH-ing entry, and that a HIT signal will be output from the CMOS Inverter 19 when the CMOS Inverter (19) switches in response to the Match Line voltage ($V_{ML}$) rising to or above the Match Detection Voltage ($V_{MD}$). Consequently, the Match Detection Voltage ($V_{MD}$) of Yoshiaki can not be less than the CMOS Inverter Switching Voltage ($V_{CMOSIS}$) of the CMOS Inverter 19, which may equal or exceed One-Half of the Supply Voltage ($V_{CC}/2$) in order to reliably register a HIT. The Match-event-detection circuit and method of Yoshiaki consumes energy (e.g., by through-currents through all MISS-ing entries) for an excessive period of time after a MATCH-event.

The explosive growth and increasing speed of Intranets and the Internet is fueling the demand for larger, faster, and more energy-efficient CAM circuits. The large CAM memory arrays of the related art-can consume multiple watts of power during performance of search operations. As the length N and entry-width X of CAM arrays continues to increase and searching becomes more frequent, the need to reduce the power consumed during CAM search operation also increases.

SUMMARY OF THE INVENTION

In designing CAMs, it is desirable that the CAM use the least energy possible when performing searches, and that each search generates a reliably detectable Match/HIT event when a MATCH-ing word is stored in an entry in the CAM. Accordingly, the present invention provides, inter alia, an improved Match-Detection Circuit and Match-detection method, for searching a Content Addressable Memory. An embodiment of the invention provides Match Detection circuitry and a method of operation that can support many known CAM storage-cell circuit topologies (e.g., Binary/

Ternary/Global Masking CAM cells; SRAM/DPAM CAM cells; NFET/PFET CAM cells) while providing reduced energy consumption and other advantages over the related art.

The inventive CAM system achieves its search performance by simultaneously comparing all entries in the CAM memory with an externally applied "comparand." Words stored in the entries of the CAM array which "match" the comparand result in a Higher voltage on the Match Line and consequently the HIT line voltage ($V_{HL}$) rises to a logic High voltage level, while all stored words that contain even a single bit that mis-matches (i.e., does not match) the comparand's corresponding bit result in a Match line Low voltage (false) (and HIT Line voltage ($V_{HL}$) stays Low). The Match Detection Voltage ($V_{MD}$) of the present invention is the lower bound of the aforesaid "Higher Match line voltage level" on the Match Line. The Match Detection Voltage ($V_{MD}$) of embodiments of the invention is normally less than One Half of the Supply Voltage (i.e., less than Vcc/2).

The through-current in each MISS-ing entry is turned off completely by a carefully timed control signal at the end of the Match Detection Period and relatively soon after a MATCH-ing entry is detected or is reliably detectable. Circuits for generating the specially timed control signal to turn off the through-currents of MISS-ing entries are disclosed.

Accordingly, a first aspect of the invention provides a content addressable memory (CAM) device comprising: an entry that includes a plurality of CAM cells each coupled to a leg of a plurality of legs of a Match Line Pass-Gate and a Match Line having a Match Line Voltage, and being coupled to the Match Line Pass-Gate, such that when any legs of the Match Line Pass-Gate is conducting the Match Line is coupled to a Low voltage level; and further comprising a Match-Detection Circuit including a Field Effect Transistor (FET) coupled to the Match Line and adapted to detect a MATCH-ing entry wherein the MATCH-ing entry is characterized by the rise of the Match Line Voltage from a Low voltage level to a Match-Detection voltage within a Match-Detection Period.

A second aspect of the invention provides an improved Match-detection circuit for a CAM entry comprising a Field Effect Transistor (FET), the gate of the Field Effect transistor being coupled to the Match Line and the FET being adapted to pull-down a node FLOAT-ing at a High voltage down towards a Low voltage when the voltage on the Match Line rises to the conducting Threshold Voltage of the FET.

A third aspect of the invention provides a digital system, such as for example, a computer, or a network router, comprising a digital processor operatively coupled to a CAM array; the CAM array having Match-detection circuits including a FET as in the forgoing aspect of the invention.

BRIEF DESCRIPTION OF THE DRAWINGS

The exemplary embodiments of the present invention will hereinafter be described in conjunction with the appended drawings, where like designations denote like elements, and:

FIG. 3cii depicts a diagram of Match Line voltage and current magnitudes during a CAM search on a MISS-ing entry controlled by an embodiment of the inventive Match Line Controller;

DETAILED DESCRIPTION OF INVENTION

The invention provides, inter alia, a Match Line Controller including an improved Match-Detection Circuit, for detecting MATCH-ing entries in a Content Addressable Memory array. A CAM array 221, as depicted in FIG. 2b, storing N data words (i.e., having N "entries") has N Match Lines (e.g., $ML_0$, $ML_1$, $ML_2$, ... $ML_{N1}$; where N=Y×L; Y is an integer representing the number of entries that are controlled per Match Line Controller circuit; L is an integer representing the number of Match Line Controller circuits per CAM array), one Match Line for each entry, each entry having a unique n-bit (n=BASE2LogN) address within the CAM. In an embodiment of the invention, each entry and Match Line combination is coupled to a Match Line Controller MLC that includes a Match-Detection Circuit 210, as depicted in FIG. 2a.

Figure 1:
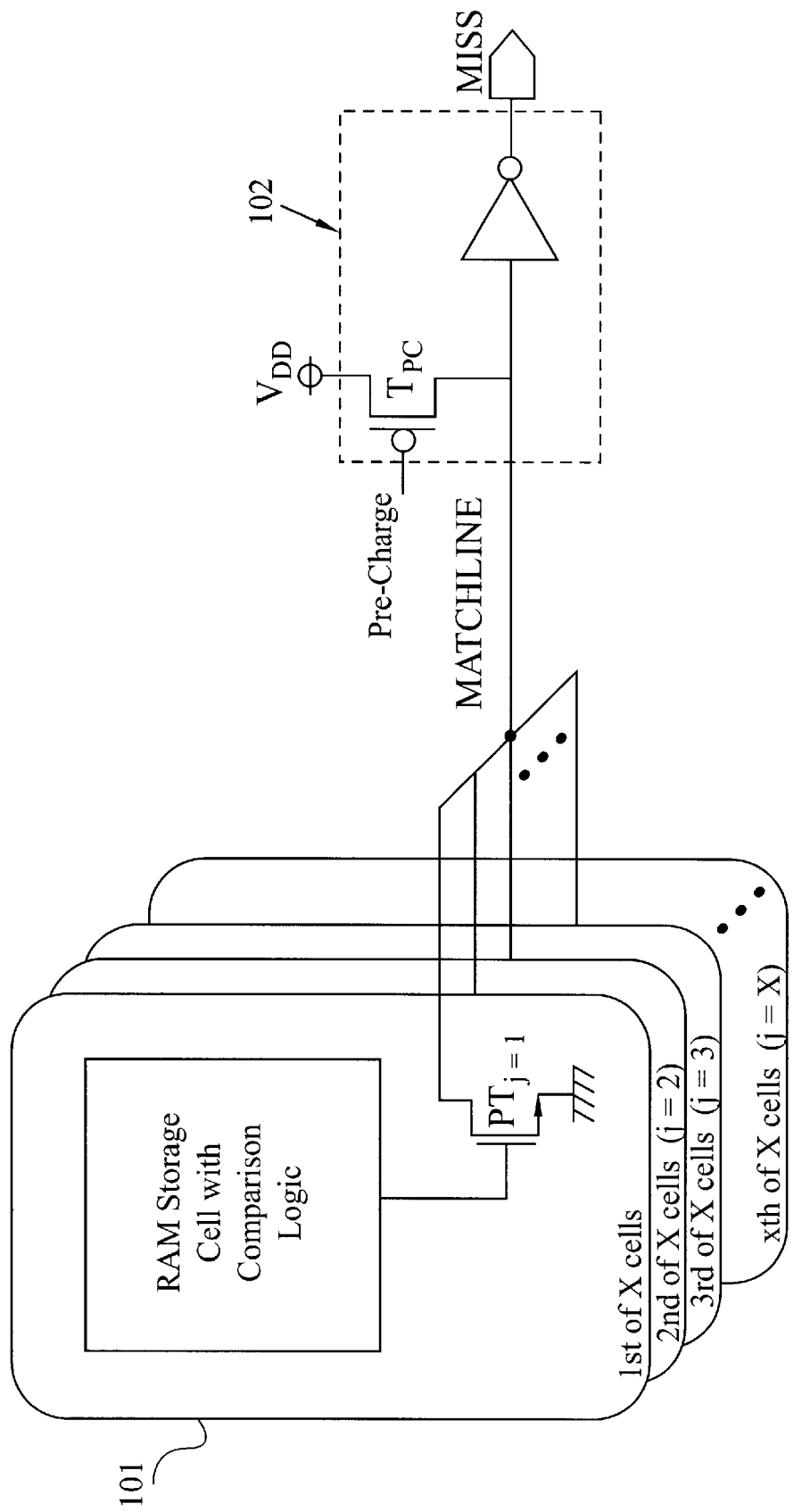
FIG. 1 depicts a circuit diagram of a Content Addressable Memory (SCAM) cell having a single pass-transistor coupled to a plurality of other such CAM cells and to a MISS-Detection circuit of the related art through a Match Line.
Figure 2A:
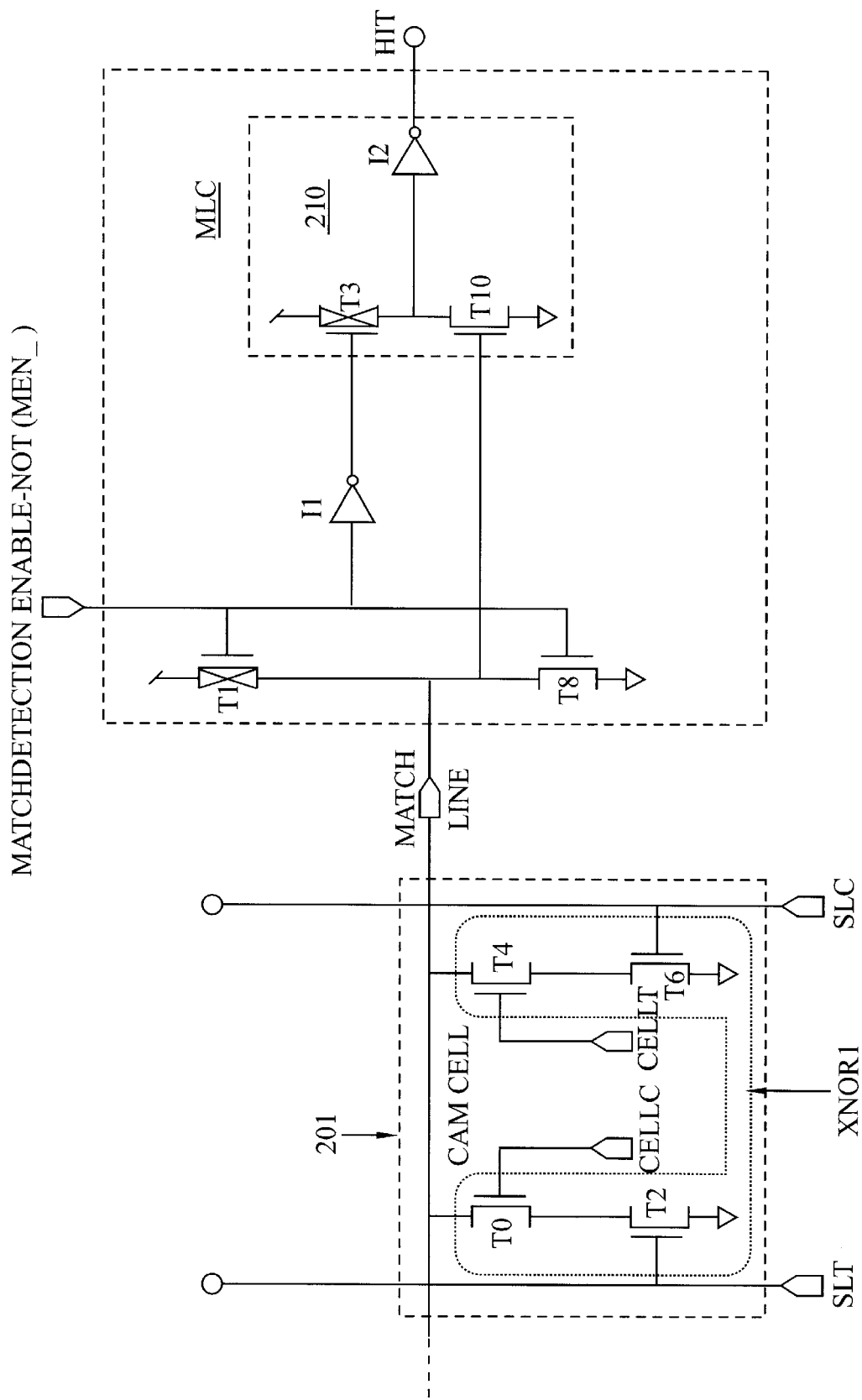
FIG. 2a depicts the inventive Match Line Controller coupled to the Match Line and to a 2-Hi NFET XNOR comparator in accordance with embodiments of the present invention.
Figure 2B:
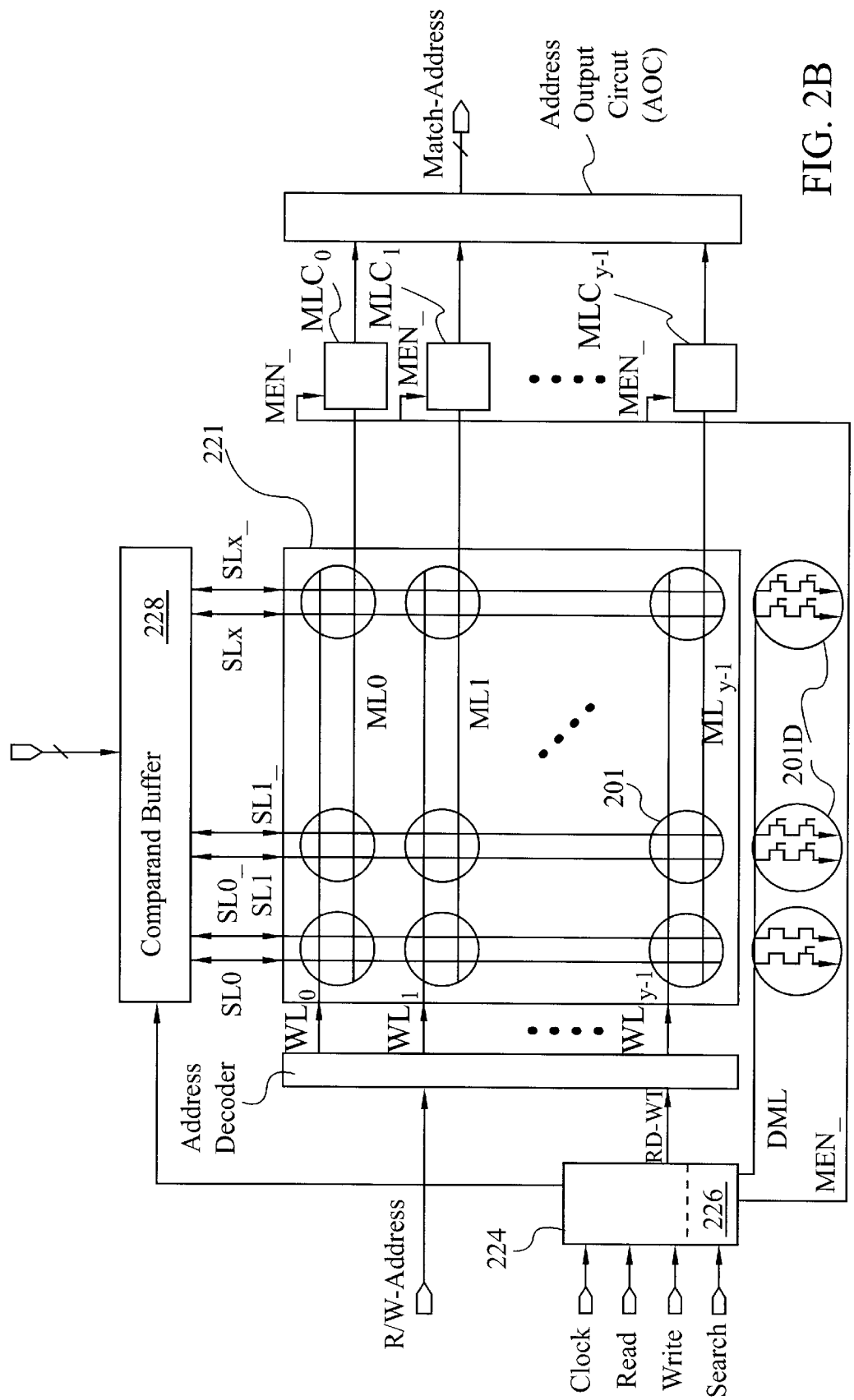
FIG. 2b depicts a CAM array comprised of plurality of entries and Match Lines coupled to a plurality of the inventive Match Line Controllers in accordance with embodiments of the present invention.

FIG. 2a depicts an embodiment of the inventive Match Line Controller (MLC) including an improved Match-Detection Circuit (210) coupled to a Match Line that is coupled to an exemplary (e.g., ternary) CAM cell 201. The CAM cell is comprised of two binary storage elements (e.g., memory storage cells CELLC and CELLT) and has an XNOR function realized in two NFET transistor stacks (T0–T2 and T4–T6). Prior to a CAM search operation, control signal MATCHDETECTION-ENABLE-NOT (MEN_) is High, thereby pre-charging the MATCH LINE to a Low voltage. This Pre-Search (i.e., initial) High state of control signal MEN_ also precharges FLOAT High and, therefore, HIT is Low (i.e., NO-HIT) prior to a CAM search. During a CAM search operation, which occurs within a Match-Detection Period during which control signal MEN_ is Low, the Match Detection circuit 210 of the Match Line Controller coupled to a MATCH-ing entry will detect the match, and HIT will only then go to a logic High (i.e., TRUE) voltage level. The control signal (MEN_) input to the Match Line Controller may be generated by the inventive timing control signal generation circuit depicted in FIGS. 2b, 4a, 4b, 4d and 4e.

The function of the inventive Match-Detecting Match Line Controller (MLC) of FIG. 2a may be better understood in a broader context, as an element of the larger circuit of FIG. 2b. FIG. 2b depicts an exemplary arrangement of the inventive Match Line Controller (MLC) in connection with a CAM array 221 having a CAM controller 224 which may contain the timing control signal generation circuit (i.e. timing controller 224) for generating and asserting the MEN_ control signal to the inventive Match Line Controller MLC. The output of the timing controller 226 is transmitted to each of Y Match-Line Controllers $MLC_0$ TO $MLC_{Y-1}$, each of which contains Match-Detection Circuit 210 for detecting a MATCH-ing word stored in the Y entries of the CAM array 221 according to methods of the present invention. The Match Line Controllers $MLC_0$–$MLC_{Y-1}$ are connected to the Match Lines $ML_0$ TO $ML_{Y-1}$, respectively, and are identical in construction with each other, and may be referred to collectively herein as MLC. To each of the Match-Line Controllers $MLC_0$–$MLC_{y-1}$ there is input the timing control signal MEN_ that is generated by the Timing Controller (e.g., 226) when the CAM search operation is to be performed. Each vertical column of CAM cells has a pair of differential Search Lines inputs (e.g., SL0 and its complement SL0_) which are coupled to the comparand buffer 228. Each horizontal CAM entry is coupled to a Match Line (e.g., $ML_0$) which in turn is coupled to a Match Line Controller, as depicted in FIGS. 2a and 2b. A "Word Line" input may be coupled to all the memory cells of each entry, and BIT LINES may be coupled to each cell of the entry, to support the writing of data into each memory cell of the entry.

As shown in FIG. 2b, each of the output of each of the plurality (i.e., Y) of Match Line Controllers $MLC_0$–$MLC_{Y-1}$ may be connected to an Address Output Circuit (AOC). The Address Output Circuit (AOC) is connected to the output of each MLC such that it can latch a "HIT" High signal which may be output from one or more of the Match-Line Controllers $MLC_0$ to $MLC_{Y-1}$ where the CAM search operation detects a MATCH-ing entry. The HIT signal can be latched High by using the HIT signal as the SET input to a Set/Reset latch. The MLC will output a logic High "HIT" signal when the Match-Detection Circuit 210 of the MLC detects that the data word stored in a CAM entry is identical to (i.e., matches) the comparand stored in the comparand buffer 228. The AOC then outputs the address of the MATCH-ing CAM cell entry as a match address MATCH-ADDRESS.

A CAM search is performed during the Match-Detection Period. The Match Detection Period begins when the control signal MEN_ input to the MLC falls to Low. It is assumed that before a reliable HIT can be output during the Match Detection Period, data to be searched shall have been stored in each content addressable memory (CAM) cell 201 of a plurality of entries of the CAM array 221, and a comparand shall have been stored in the comparand buffer 228 such that the 2x differential search lines (e.g., SL0, SL0_, SL1, SL1_, SL2, SL2_, . . . SLx, Slx_; where (x=X−1)) are asserted within the Match Detection Period. The Match Detection Period ends when the control signal MEN_ transitions from its Low (search-enabling) voltage (i.e., logic Low voltage) back to the initial (pre-search) High voltage. The optimization of the length of time ($t_2$) between the beginning and end of the Match Detection Period is discussed in other sections of this disclosure.

Referring again to the embodiments of the inventive Match Line Controller depicted in FIG. 2a, the initial (pre-search) logic HIGH voltage on the MEN_ line presents a logic HIGH voltage at the gates of both of stacked transistors PFET T1 and NFET T8 and at the input of inverter I1, thereby causing PFET T1 to be initially OFF (i.e., non-conducting), and causing NFET T8 to be initially ON (i.e., conducting), and causing pull-up transistor T3 to be initially ON, while T10 is initially OFF (due to the Low pre-charge voltage of the Match Line due to T8 being ON). Inverter I1 may be formed by a stacked NFET-PFET pair, or by any other equivalent inverting circuit known to persons in the art. Alternatively, inverter I1 may be eliminated in an alternative embodiment, (e.g., by implementing T3 as a NFET, which will operate reliably if the supply voltage ($V_{CC}$) is high enough to compensate for the larger effective switching threshold voltage ($V_T$) of NFET T3 as a function of the source-substrate voltage.) The circuit of FIG. 2a including PFET T3 has operated reliably in simulation with a supply voltage ($V_{CC}$) as low as 1.0 volts).

The electrically conductive Match Line of each CAM entry inherently has a capacitance $C_{ML}$ and is connected to each of the stacked control transistors, (i.e., pull-up transistor T1 and pulldown transistor T8), and to the plurality of the legs of the distributed pass-gate on the Match Line (e.g., pass-transistor-stack T0–T2 and pass-transistor-stack T4–T6). The Match Line Pass-Gate functions as a logical NOR-gate during the Match Detection Period such that the Match Line Pass-Gate (NOR-gate) will conduct, thereby holding the Match Line (the effective NOR-gate output) at a logic Low voltage level (indicating a MISS, or a NON-MATCH) if even one leg of the Match Line Pass-Gate is conducting (ON), such as when the word stored in the CAM entry is a mis-match with the comparand. Each leg of each XNOR-gate (e.g., XNOR1) (e.g., T0–T2 and T4–T6 of the exemplary CAM cell 201), and of each CAM cell in a CAM entry, functions as one leg of the Match Line Pass-Gate (i.e, NOR-gate).

As previously mentioned, prior to a search (i.e., before the Match-Detection Period wherein MEN_ is Low) the MATCH LINE is pre-charged to (i.e., pulled down to) a Low voltage level (e.g., ground) through NFET T8, while PFET T1 is OFF. (The Match Line of a MISS-ing entry may also be pulled down to logic Low voltage prior to a search by one or more legs of the Match Line Pass-Gate, because it is not necessary that the Search Lines be precharged Low).

Because the MATCH LINE is coupled to the gate of NFET transistor T10, the initial Low voltage level on the MATCH LINE causes T10 to be non-conducting (OFF) prior to the search. Meanwhile, prior to the search, the output of inverter I1 asserts a Low voltage level at the gate of PFET T3, thus causing T3 to be conducting (i.e., ON). The initial combination of T3 being ON (i.e., conducting) and T10 being OFF (i.e., non-conducting) precharges the FLOAT node initially to a logic HIGH voltage level, which in turn brings the output of the inverter I2 (which has its input connected to the FLOAT node) to a logic Low voltage, which indicates the absence of a logical HIT True condition (i.e., HIT=FALSE) by asserting Low voltage level on the HIT line prior to the Match Detection Period. It is worthy of note that the FLOAT line has a finite capacitance such that if subsequent to establishing the initial High voltage pre-charge condition, T3 is turned OFF (while T10 remains OFF), the HIGH pre-charge voltage on the FLOAT line will continue and the output of inverter I2 coupled thereto will continue to indicate the absence of a logical HIT True condition, by asserting a Low voltage level on the HIT line.

It is assumed that at the beginning of and during the Match-Detection Period, the memory cells (e.g. CELLT and CELLC) and the Search Lines (e.g., SLC, SLT) of the Entry of the Match Line are properly powered and are static to enable a reliable search such that each of the legs of the pass-gate (e.g., the XNOR transistor stacks) will be either conducting (ON) or non-conducting (OFF) depending only upon the logical values of the data bits stored in the memory cells and the logical value of the comparand bits represented on the search lines.

If the entry contains a match compared against the search data (i.e., comparand), then none of the pass-transistor-stacks (e.g. XNOR1 NFET stacks) in the CAM cells connected in parallel to the Match Line will be ON (i.e., conducting), and current running into the Match Line during the Match Detection Period will pull the MATCH LINE voltage ($V_{ML}$) UP. Eventually, the Match Line Voltage ($V_{ML}$) will exceed NFET T10's threshold voltage ($V_T$), and NFET T10 will begin to conduct. FLOAT will be discharged Low through NFET T10, and the HIT output of the MLC will rise to True (i.e., High logic voltage) as the dropping voltage of FLOAT is inverted by Inverter I2. If the CAM entry contains a mismatch compared against the search data (i.e., comparand), then at least one of the pass-transistor-stacks (e.g. XNOR NFET stacks) in the CAM cells connected in parallel to the Match Line will be ON (e.g., T0–T2 OR T4–T6), and the Match Line Voltage will be held Low through the at least one of the pass-transistor stacks.

At the beginning of the Match-Detection Period, the control signal voltage MEN_ drops from the initial HIGH voltage level to a search-enabling Low voltage level and remains Low during the Match Detection Period. When the voltage on the MEN line falls from High to Low at the beginning of a search, the gates of transistors T1 and T8 are pulled Low, thereby turning PFET T1 ON (i.e., conducting) and turning NFET T8 OFF (i.e., non-conducting) such that the MATCH LINE is electrically connected to the Supply Voltage, and electric current will flow through T1 into the MATCH LINE which had been pre-charged to a lower voltage level. At approximately the same time that current begins to flow into the MATCH LINE through T1, the FLOAT node pull-up transistor PFET T3 is turned OFF (non-conducting) In the circuit of FIG. 2a this is because the inverter I1 has inverted the Low voltage search-enabling control signal now asserted on the MEN_ line, and the small capacitance of the short line coupled to the gate T3 does not significantly delay the switching of T3 (OFF). However, the FLOAT node pull-down transistor NFET T10 will not turn ON immediately (i.e., not at the beginning of the Match Detection Period) even if there is a MATCH in the entry making all the legs of the Match Line Pass-Gate OFF, because the capacitance $C_{ML}$ of the Match Line is significantly large. If the entry is a MISS, at least one leg of the Match Line Pass-Gate will be conducting, and will therefore hold the Match Line to the logic Low voltage level (at or below an asymptotic level). Therefore, for a finite period of time at the beginning of every Match-Detection Period, both transistors T3 and T10 will be OFF (non-conducting) and the FLOAT node will be floating as a small capacitor at the initial logic High Pre-charge voltage, and the HIT output of inverter I2 coupled thereto will continue to indicate the absence of a HIT (i.e., a logic Low voltage). The preliminary logic High voltage floating state of the FLOAT node within the Match-Detection Period facilitates the detection of a MATCH-event on the Match Line by NFET transistor T10 with a Match-Detection Voltage less than ONE-HALF of the Supply Voltage, and eliminating the deficiencies of employing the stacked NFET-PFET type INVERTER provided for Match-event detection in the related art.

Because a MATCH-ing entry may be detected (and output as a HIT) by the inventive circuit as the result of a transition of only one transistor (i.e., NFET T10) from OFF to ON, the inherent Threshhold Voltage ($V_T$) of that one transistor is the lower bound of the Match-Detection Voltage ($V_{MD}$) of the present invention. In the circuits of the related art that rely upon a CMOS Inverter (comprising an NFET stacked in series with a PFET) to detect the MATCH-event, the lower bound of the Match-Detection Voltage therein is approximately the mid-voltage point between Supply Voltage and ground, which may be many times higher than the conducting threshold voltage $V_T$ of an NFET. Thus, the present invention can detect a MATCH-ing entry and turn off the through-currents in the Match Line of a MISS-ing entry faster than the related art, thus reducing the minimum required Match Detection Period, and reducing the energy ($E_{MISS}$) consumed by the through-current of each MISS-ing entry during each CAM search operation.

Figure 3A:
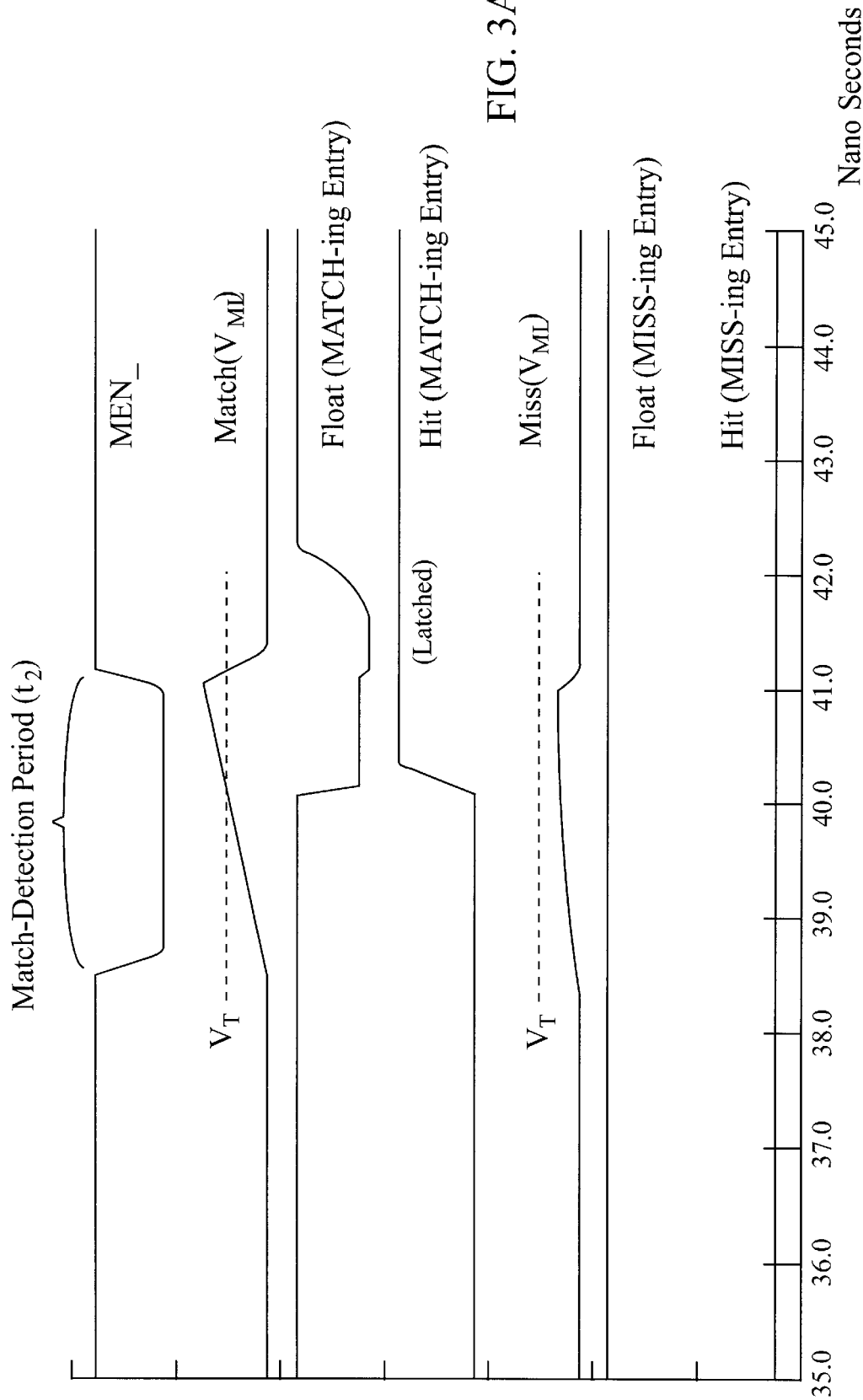
FIG. 3a depicts a timing diagram of an embodiment of the inventive Match Line Controller depicting an exemplary timing relationship of the control signal and MATCH and MISS and HIT-output.
Figure 3B:
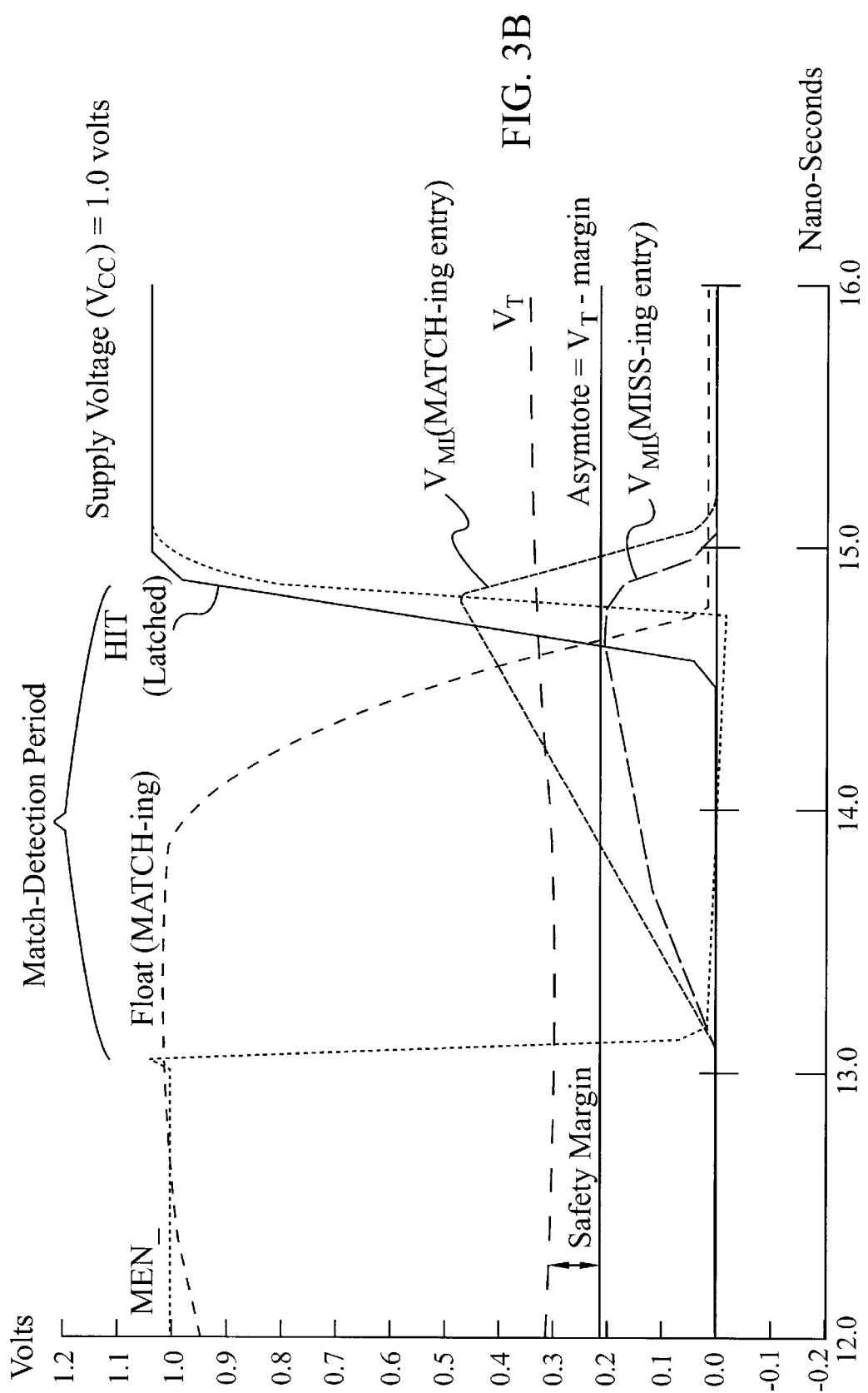
FIG. 3b depicts a timing diagram of an embodiment of the inventive Match Line controller depicting exemplary control signal and MATCH and MISS and HIT-output timing.
Figure 3C:
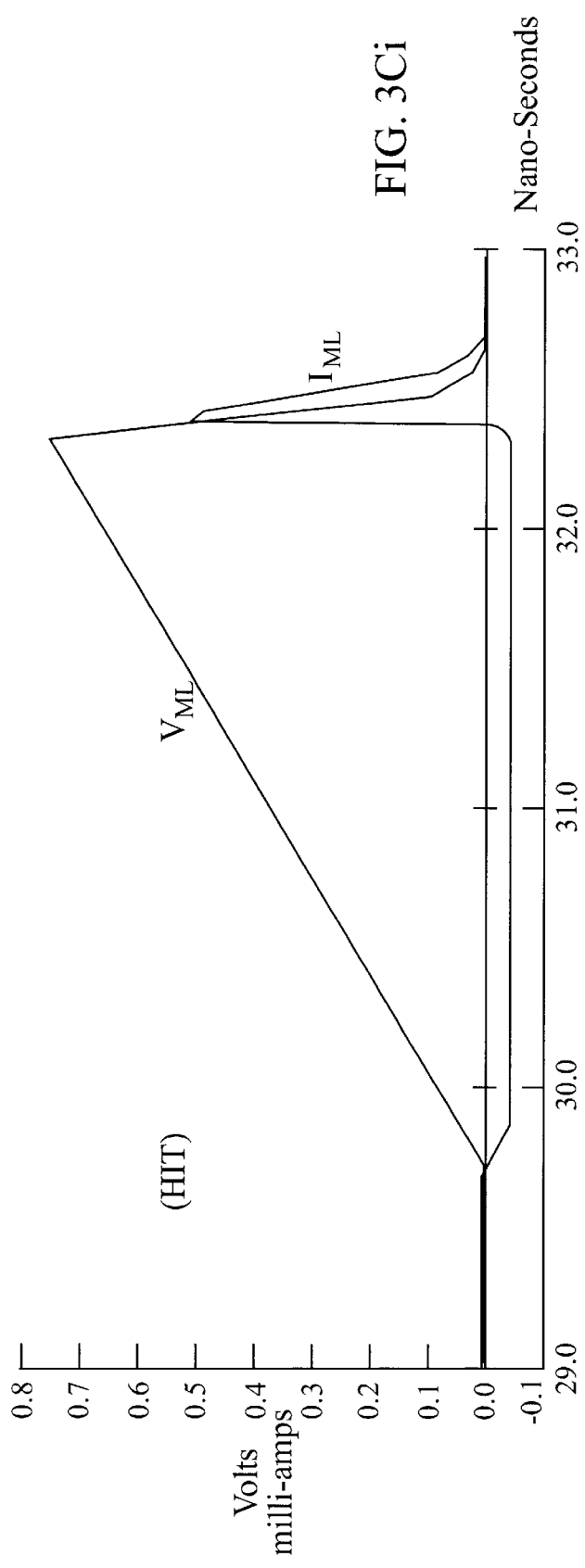
FIG. 3ci depicts a diagram of Match Line voltage and current magnitudes during a CAM search on a MATCH-ing entry controlled by an embodiment of the inventive Match Line Controller.

The timing, polarity and relative magnitude of the Match Line Current ($I_{ML}$) in MATCH-ing and MISS-ing entries in an embodiment of the invention is illustrated in FIGS. 3ci and 3cii respectively. As illustrated in FIGS. 3ci and 3cii, the invention provides a control signal that is adapted to enable the Match-Detection Circuit at the beginning of the Match-Detection Period, and is further adapted to turn off a Match Line through-current ($I_{ML}$) in a MISSING-entry at the end of the Match-Detection Period.

The Match Line Current ($I_{ML}$) passes through weak pull-up transistor T1 in both MATCH-ing and MISS-ing entries during the Match Detection Period. At a beginning portion of the Match-Detection Period, the Match Line Current ($I_{ML}$) of MATCH-ing and MISS-ing entries will be approximately the same. The Match Line Current $I_{ML}$ of a MATCH-ing entry will thereafter decrease during the Match-Detection Period as a function of the increasing Match Line Voltage ($V_{ML}$), because the Match Line is charging as a capacitor. The Match Line Current $I_{ML}$ of a MISS-ing entry will thereafter level-off and continue during the Match-Detection Period at approximately an asymptotic magnitude determined by the supply voltage divided by the total resistance of the $I_{ML}$ current path. The total resistance of the $I_{XL}$ current path will include the ON-resistance of transistor T1 and the ON-resistance of the Match Line Pass-Gate (e.g., the ON-resistance of the conducting parallel-resistor legs of the XNOR-gates of the CAM cells coupled to the Match Line, which legs are comprised of pass-transistor/stacks).

If T1 is turned OFF as soon as the Match Line voltage of a MATCH-ing entry has certainly had time enough to rise and discharge FLOAT (i.e. $V_{ML}$ equal to or greater than $V_T$ of NFET T10), causing HIT to rise to True (i.e., logic High voltage) and be latched, then the total amount (i.e., charge) of through-current ($I_{ML}$) consumed per MISS-ing Match Line is minimized. Thus energy consumption during each search can be minimized by minimizing the length of the Match-Detection Period. (Accordingly, the width and length of transistor T10 may be chosen to minimize the ON-resistance of T10 to allow FLOAT to discharge at high rate, thus enabling a shorter Match-Detection Period, which in turn further reduces the power consumption of each search operation of the CAM. Transistor T10 may also be chosen to be wider and longer than the minimum device allowed by the technology groundrules to minimize the effects of normal variations due to photo effects, doping mismatches etc.)

A voltage divider network (comprised of T1 and of at least one of the plurality of pass-transistor-stacks coupled to the Match Line) is formed between supply voltage (e.g., Vdd) and ground. Thus, the voltage on the Match Line of a MISS-ing entry can rise only to some maximum asymptotic level regulated by the ratio of the resistance of the lower portion of the voltage divider (i.e., the ON resistance of one or more pass-transistor-stacks coupled between the Match Line and ground (e.g., an NFET-stack in XNOR1)) divided by the resistance of the upper portion of the voltage divider (e.g, the ON resistance of T1). Ideally, the maximum asymptotic level of a MISS-ing entry will be below the switching threshold voltage ($V_T$) of NFET T10 of the Match-Detection Circuit 210. However, such a condition is not necessary to the effective operation of all embodiments of the invention, because MATCH-ing entries inherently will raise the Match Line Voltage ($V_{ML}$) faster, (and therefore cause $V_{ML}$ to reach the switching threshold voltage of T10 faster) than MISS-ing entries.

FIG. 3a depicts an exemplary timing relationship and the rise-time of $V_{ML}$ in MATCH-ing and MISS-ing entries in embodiments of the invention. As depicted in FIG. 3a, when the Match-Detection Period begins, the Match Line voltage $V_{ML}$ of MATCH-ing and MISS-ing entries both initially rise. However, the $V_{ML}$ of a MATCH-ing entry rises faster and will generally reach $V_T$ before the $V_{ML}$ of a MISS-ing entry reaches its asymptotic level. Thus, a reliable High HIT-output may be asserted by the MLC, and latched High by the AOC or another circuit, before the $V_{ML}$ of a MISS-ing entry reaches its asymptotic level. Therefore, if the asymptotic $V_{ML}$ level of a MISS-ing entry happens to exceed $V_T$, the Match-Detection Period may be terminated before the $V_{ML}$ of a MISS-ing entry reaches $V_T$. Of course, if the asymptotic $V_{ML}$ level of a MISS-ing entry is a safe margin less than $V_T$, the Match-Detection Period can be extended without the possibility of a MISS-ing entry generating a (false) HIT output. (But as previously explained, energy is conserved by minimizing the Match-Detection Period.)

FIG. 3b illustrates an exemplary timing relationship between the HIT-output and the rise of $V_{ML}$ in MATCH-ing and MISS-ing entries, in an embodiment of the invention wherein the Match-Detection Period is minimized such that the Match Detection Period ends virtually immediately after a High HIT output is reliably asserted and latched High. The Match Detection Period need only be long enough such that a Match stored in a CAM entry coupled to the Match Line will be reliably detected and reported as a logically True HIT signal (e.g., a Logic HIGH voltage on the HIT output of MLC), which may be latched High. The HIT-output signal will first be asserted High when the intermediate FLOAT node falls below the CMOS Inverter Switching Voltage ($V_{CMOSIS}$) of the CMOS Inverter I2. Because FLOAT node voltage will begin to drop Low as soon as $V_{ML}$ of a MATCH-ing entry rises to $V_T$ of transistor T10 (i.e., before $V_{ML}$ of a MATCH-ing entry rises to $V_{CC}/2$, and before $V_{ML}$ of a MISS-ing entry rises to $V_T$), a High HIT-output can be reliably asserted and latched High (and the Match Detection Period can be ended) before $V_{ML}$ of any entry reaches $V_{CC}/2$. The Supply Voltage ($V_{CC}$) of the circuit embodying the invention that produced the timing signals of FIG. 3b is 1.0 volts, which is a "worst-case" of a nominal 1.2 volt Supply Voltage.

As illustrated by the time-versus-voltage information in FIG. 3b, embodiments of the invention: can detect a MATCH-ing entry even if the Match Line Voltage never rises to ONE-HALF of the Supply Voltage; can detect a MATCH-ing entry when the Match Line Voltage rises to the conducting Threshold Voltage of a Field Effect Transistor (e.g. NFET T10); can output a HIT signal when the Match Line Voltage ($V_{ML}$) is more than the conducting Threshold Voltage of the Field Effect Transistor (e.g, NFET T10) and less than ONE-HALF of the Supply Voltage; can output a HIT signal when the Match Line Voltage ($V_{ML}$) is between about 100 percent (e.g., 0.3 volts) and about 166 percent (e.g., 0.50 volts) of the conducting Threshold Voltage of the FET (e.g. NFET T10); can perform a CAM search within a Match-Detection Period that is less than twice the inherent period of time it takes for the Match Line Voltage of a MATCH-ing entry to rise from the Low voltage level to ONE-HALF of the Supply Voltage; can perform a CAM search within a Match-Detection Period that is less than the inherent period of time it takes for the Match Line Voltage of a MATCH-ing entry to rise from the Low voltage level to a High voltage level equal to about 90 percent of the Supply Voltage (i.e., which may be proved by extrapolating the forward-sloped line of the rising $V_{ML}$ of the MATCH-ing entry within the Match Detection Period to a point where it would intersect a horizontal line denoting 0.9 volts if the control signal MEN_ had not been raised High, thus ending the Match Detection Period, before $V_{ML}$ reached 0.9 volts); can perform a CAM search within a Match-Detection Period that is less than four times the inherent period of time it takes for the Match Line Voltage of a MATCH-ing entry to rise from the Low voltage level to a High voltage level equal to about 90 percent of the Supply Voltage (which is obvious from the preceding extrapolation); can perform a CAM search within a Match-Detection Period that is not greater than the inherent period of time it takes for the Match Line Voltage of a MATCH-ing entry to rise from the Low voltage level to a voltage level equal to about 166 percent of the conducting Threshold Voltage of the FET (e.g., the exemplary Match Detection Period depicted in FIG. 3b ends before $V_{ML}$ of a MATCH-ing entry has time to reach 0.5 volts which is approximately about 166 percent of $V_T$.); can perform a CAM search within a Match-Detection Period that is not greater than the inherent period of time it takes for the Match Line Voltage of a MATCH-ing entry to rise from the Low voltage level to a voltage level equal to about 120 percent of the conducting Threshold Voltage of the FET (this ability is indicated by the fact that FLOAT begins to discharge as soon as $V_{ML}$ of a MATCH-ing entry reaches $V_T$, and by the expectation that a Match Line coupled to only a small number (e.g., four) of CAM entries will have a small enough capacitance to allow FLOAT to drop rapidly); can end energy consumption in MISS-ing entries at the end of a Match-Detection Period that is not greater than the inherent period of time it takes for the HIT output to be latched High; can perform a CAM search within a Match-Detection Period that is less than the inherent period of time it takes for the Match Line Voltage of a MISS-ing entry to rise from the Low voltage level to the conducting Threshold Voltage of the FET (e.g., as shown in FIG. 3b, the Match Detection Period ends before $V_{ML}$ of a MISS-ing entry rises to an Asymptote less than $V_T$, which would occur before the $V_{ML}$ could rise higher to $V_T$)

As illustrated in FIG. 3b, the end of a minimal Match-Detection Period may coincide approximately with the fall of the voltage on the intermediate node, FLOAT, to Low. Therefore the duration of the Match-Detection Period can be reduced by increasing the speed of the High-to-Low transition of the FLOAT node.

The voltage on the intermediate node FLOAT transitions from High to Low relatively slowly because the significant capacitance of the Match Line of a MATCH-ing entry is being charged through the ON resistance of T1. Therefore, the Match Detection Period can be reduced further (and the frequency of Searches increased) by reducing the capacitance of the Match Line, and/or by reducing the ON resistance of T1. (As discussed below, an effective reduction of the capacitance of the Match Line, and a reduction of the Match Detection Period, may be accomplished by providing a circuit for detecting a match in a limited number of Pre-Select CAM cells in an entry coupled to a PRE-MATCHLINE and only then searching the remainder of the CAM cells of the entry coupled to a POST-MATCHLINE.) Reducing the ON resistance of T1 will tend to reduce the safety margin between the Asymptotic level on a MISS-ing Match Line and $V_T$ of transistor T10. Therefore, the ON resistance of T1 is selected based upon the CAM circuit designer's balancing of a need for a safety margin versus a desired higher speed of the CAM search operation. As depicted in FIG. 3b, the asymptotic $V_{ML}$ level may be fixed at a safe margin below the minimum $V_T$ of transistor T10, such that the Asymptote voltage level equals $V_T$ minus a "safety margin."

The actual asymptotic level of the Match Line Voltage ($V_{ML}$) in a given MISS-ing entry will vary depending upon how many bits mis-match compared against the comparand. The more bits that mis-match in a given MISS-ing entry, the lower the asymptotic level of that Match Line's voltage will be during that search period. Thus the "worst-case" for differentiating a Match from a Miss, may be where the MISS-ing entry raises the Match Line Voltage ($V_{ML}$) to an asymptotic level nearest to the threshold voltage ($V_T$) of NFET T10. This "worst-case" occurs with a single-bit mis-match in the entry. Therefore assuming that the resistance of the lower portion of the voltage divider is constrained by the logical and performance requirements for the Match Line Pass-Gate (e.g., XNOR-gates) the maximum asymptotic Match Line voltage level for MISS-ing entries is set by selecting the resistance of the upper portion of the voltage divider (e.g., the ON resistance of PFET pull-up-T1).

The size of the weak pull-up T1 may be selected such that, in the worst case of a single-bit mismatch, the asymptotic value of the MATCH line is near or below the threshold voltage ($V_T$) of NFET T10. T1 may be sized by perfoming DC simulations modeling T1 ON with a cell stack of a single-bit mismatch (e.g., T0–T2 or T4+T6) holding down the MATCH line through the metal resistance of the MATCH line. An objective is to prevent T10 from conducting and discharging FLOAT in a MISS-ing entry by keeping the level of the MATCH line below the Match-Detection Voltage (e.g., the conduction Threshold Voltage ($V_T$) of NFET T10 minus some safety margin) during the Match Detection Period. Pull-up transistor T1 may be designed longer and wider than the minimum device allowed by the technology groundrules to minimize the effects of normal variations due to photo effects, doping mismatches etc.

When size of transistor T1 is properly selected, the Match Line voltage of a MISS-ing entry cannot rise above NFET T10's threshold voltage, and FLOAT cannot discharge, during the Match Detection Period, and therefore, HIT will stay Low in the case of a MISS-ing entry. However, even when the maximum asymptotic value of the Match Line voltage exceeds the threshold voltage ($V_T$) of NFET T10, embodiments of the invention can still reliably distinguish MATCH-ing entries from MISS-ing entries because the Match Line of a MATCH-ing entry will rise faster than a MISS-ing entry, and the timing control singal (MEN_) can end the Match-Detection Period before enough time has elapsed for a MISS-ing entry to raise the Match Line Voltage up to the Match-Detection Voltage (e.g., $V_T$ of NFET T10). Thus, the circuit will perform reliably if circuit element parameters and timing signals are designed such that the Match Line Voltage of a MISS-ing entry does not rise to the Match Detection Voltage (e.g., $V_T$) within the Match-Detection Period. The rise time of the Match Line of a MATCH-ing entry is a function of the Match Line Capacitance ($C_{ML}$) and the Match Line Current ($T_{ML}$), which in turn is a function of the ON resistance of pull-up transistor PFET T1). Thus, the performance of the inventive circuit can be optimized by reducing the Match Line Capacitance, and by optimizing the ON-resistance of the pull-up transistor PFET T1.

In order to control the timing of the Match Line Controller, including the turn-off timing of pull-up transistor T1, timing control signal generation circuits (e.g, 226) are provided to optimally limit the duration of the Match-Detection Period. A plurality of embodiments of inventive timing signal generation circuits use a Dummy CAM entry circuit that emulates a MATCH-ing entry, on a Dummy Match Line which may be coupled to a Dummy Match Line Controller that generates a Dummy-HIT signal to define the end of the Match-Detection Period.

Timing Control Signal Generation Circuits

The timing control signal MEN_ is input to the plurality Y (where Y is a positive integer number) of Match-Line Controllers $MLC_0$ to $MLC_{Y-1}$ (these Match-Line Controllers will hereinafter be described as a Match-Line Controller MLC because they are identical in operation). The CAM Controller 224 may contain circuitry (e.g. 226) that generates the search-enabling control signal Matchline Enable-Not ( MEN_) and outputs the signal MEN_ to each of Y Match-Line Controllers MLC.

The timing control signal generation circuits (e.g. 401 of FIG. 4a, 411 in FIG. 4b, and 226 in FIGS. 4d and 4e), generate the carefully timed control signal MEN_ which controls the operation of the Match Line Controller (MLC). The timing control signal MEN_ may be generated from the system clock CLOCK (having a duty cycle larger than MEN_) by the circuitry 411 or 226 depicted in FIGS. 4b and 4d respectively. Alternatively, the timing control signal MEN may be generated from a pulsed GO signal (having a duty cycle shorter than MEN_) by the circuit 401 depicted in FIG. 4a. The signal generation circuitry (e.g., depicted in FIG. 4a, 4b or 4d) that generates the timing control signal MEN__ may be separated from the CAM Controller 224, and/or may be replicated and distributed on the CAM integrated circuit, or the centrally generated MEN__ signal may be buffered and fanned out, to provide a locally-generated, strong and/or low-skew MEN__ signal to each set of Y Match Line Controllers among a very large number (e.g., Y multiplied by L equals N, where L is an integer greater than one) of Match Line Controllers in a large CAM array circuit.

Figure 4A:
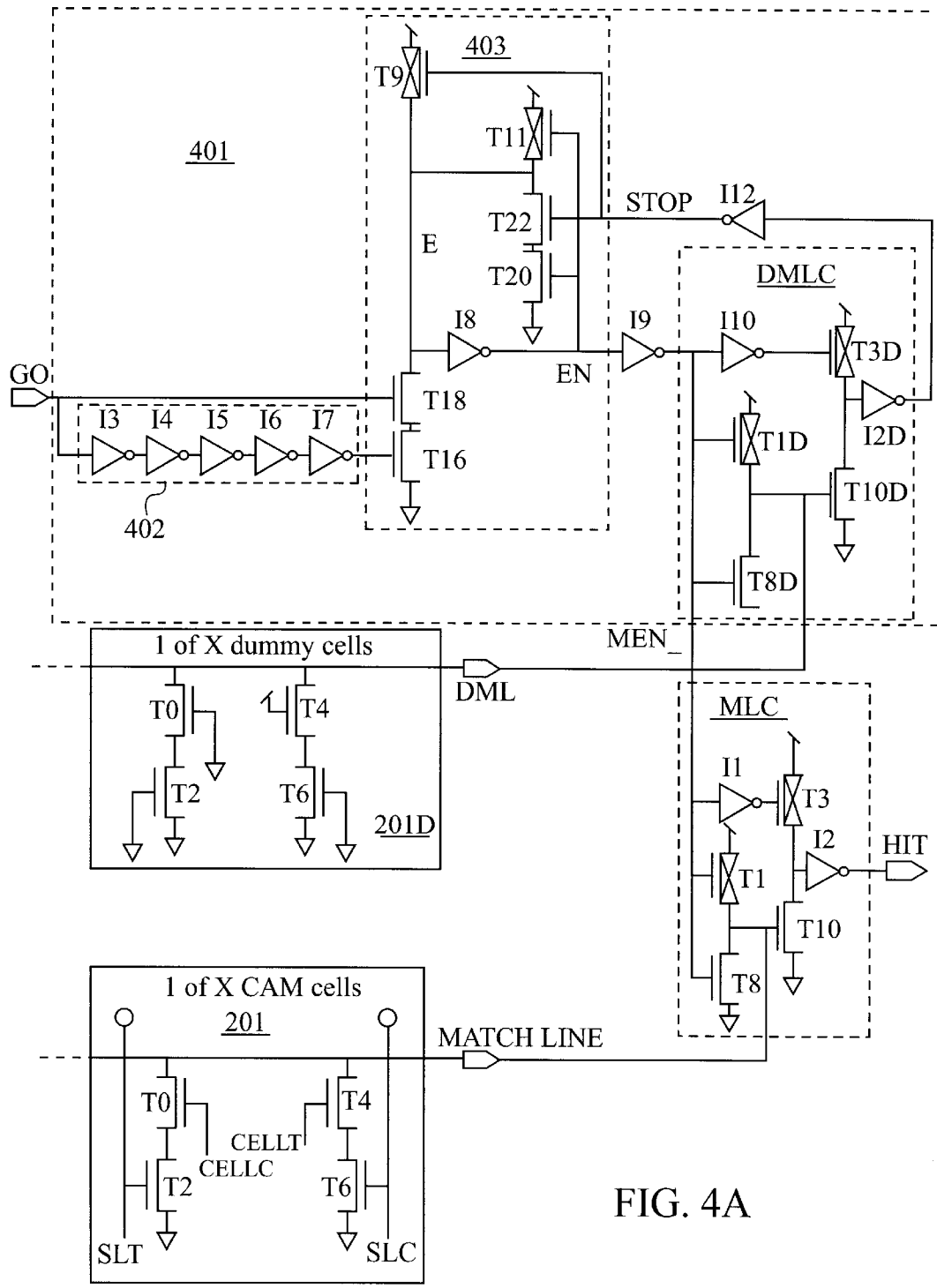
FIG. 4a depicts a circuit diagram of an inventive timing control signal generation circuit including a Dummy Match Line Controller and coupled to a plurality of inventive Match Line Controllers in accordance with embodiments of the invention.
Figure 4B:
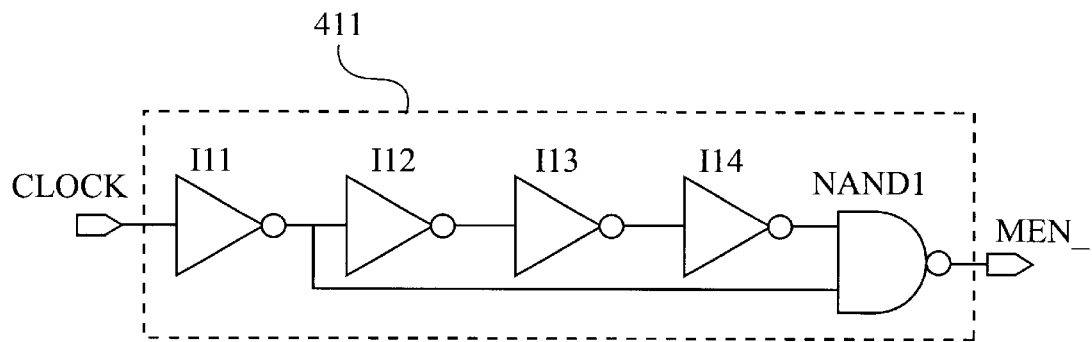
FIG. 4b depicts a circuit diagram of an alternative timing control signal generation circuit including a NAND-gate and a buffer-delay line for controlling a plurality of inventive Match Line Controllers in accordance with embodiments of the invention.
Figure 4C:
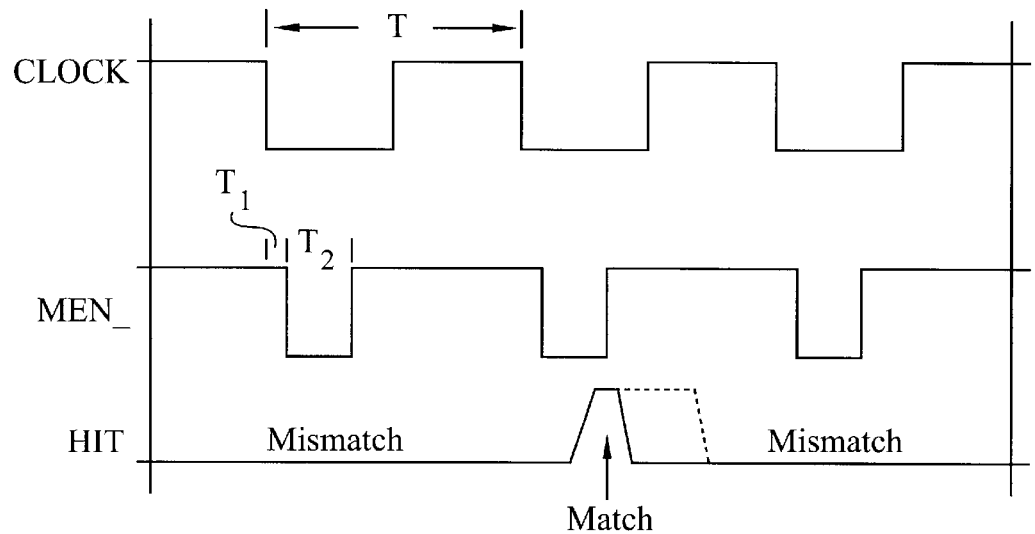
FIG. 4c depicts a timing diagram of the timing control signal generated by the timing control signal generation circuits of FIG. 4b and FIG. 4d for controlling a plurality of inventive Match Line Controllers in accordance with embodiments of the invention.

The control signal generation circuit 411 shown in FIG. 4b is driven by the system clock signal CLOCK at its input, and a NAND-gate NAND1 outputs the timing control signal Match-Line Enable-Not (MEN__). The operation of the circuit of FIG. 4b is further illustrated in the timing diagrams of FIG. 4c. As illustrated in FIG. 4c the control signal MEN__ generated from the clock signal by the circuit of FIG. 4b falls to a logic Low level following (time period $t_1$ after) the High-to-Low transition of the clock signal CLOCK, but returns to a High voltage at a finite period of time ($t_2$) after MEN falls to Low, independent of the subsequent clock signal transition. Time period $t_1$ is a propagation delay through the inverter I11. Time period $t_2$ is the sum of the propagation delay times of the plurality i (where i is an odd integer greater than one) of inverters connected in series (e.g., inverters I12–I13–I14). The time period represented by $t_2$ is effectively the Match-Detection Period during which the CAM search is performed with the Match Line Controller enabled by MEN__ being Low. Therefore, the propagation delay times of inverters (e.g., I12–I13–I14) and/or the quantity of that plurality of inverters, should be selected by the circuit designer to insure an optimal duration of the Match Detection Period: long enough for reliable detection of a MATCH-ing entry and for outputting a latchable HIT signal, and short enough to reduce unnecessary through-currents in MISS-ing entries, in accordance with embodiments of the present invention.

An inverter (e.g., I11) may be optionally included in the circuit 411 of FIG. 4b to introduce a propagation delay ($t_1$) and to provide an inverted CLOCK signal to the next stages of the signal generation circuit 411. The inverted clock signal (output from inverter I11) is branched into two lines, one line being connected directly to the input of a series of inverters (e.g., I12, I13, I14) and the other being connected to one of two input terminals of a NAND-gate NAND1. The output of the last inverter (e.g., I14) of the series of inverters (e.g., I12, I13, I14) is connected to the other of the two input terminals of the NAND-gate NAND1. The signal generation circuit 411 outputs a Low (search-enabling) timing control signal MEN__ during a Match Detection Period that is approximately equal in duration to the propagation time delay $t_2$ of the series of inverters (e.g., I12, I13, I14) within each cycle of the CLOCK signal, thereby enabling the CAM searches to be performed synchronously at the system clock frequency. Thus, the timing control signal MEN__ is at a High level prior to each search until the propagation delay time $t_1$ of inverter I11 (in FIG. 4b) elapses after the transition of the level of the clock signal CLOCK from High to Low, and MEN__ then goes to a Low (search-enabling) level and thereafter stays Low during a Match-Detection Period $t_2$ approximately equal to propagation time of the series of inverters (I12–I13–I14).

FIG. 4c also illustrates an exemplary timing relationship between the control signal MEN__, and the output at the HIT line of a Match Line Controller in the cases of MISS-ing and MATCH-ing search results. As depicted in FIG. 4c, the High (i.e., True) HIT signal output in the case of a MATCH-ing search result is ordinarily first asserted during the Match Detection Period and may continue to be asserted after the end of the Match Detection Period if it is latched. The Match-Detection Period may be extended to insure that the HIT (True) output of the MLC is asserted long enough to be latched. The HIT output signal may be latched High well beyond the end of the Match Detection Period by circuits known to persons skilled in the art.

The CLOCK signal input to the control signal generation circuits described in FIGS. 4b, 4c, 4d and 4e may of course be gated OFF (e.g., High) to prevent search power consumption during idle periods when no CAM searches are required. Further, it should be noted that although the circuits and circuit operation of FIGS. 4b, 4c, 4d and 4e are depicted as being driven by and synchronous with the system clock signal CLOCK, any other transitioning signal of suitable duty cycle can be used as a search-triggering input to these circuits, whether synchronous or asynchronous relative to the system clock, provided that valid searchable data is present in the CAM array and a comparand is being asserted via the search lines.

Figure 4D:
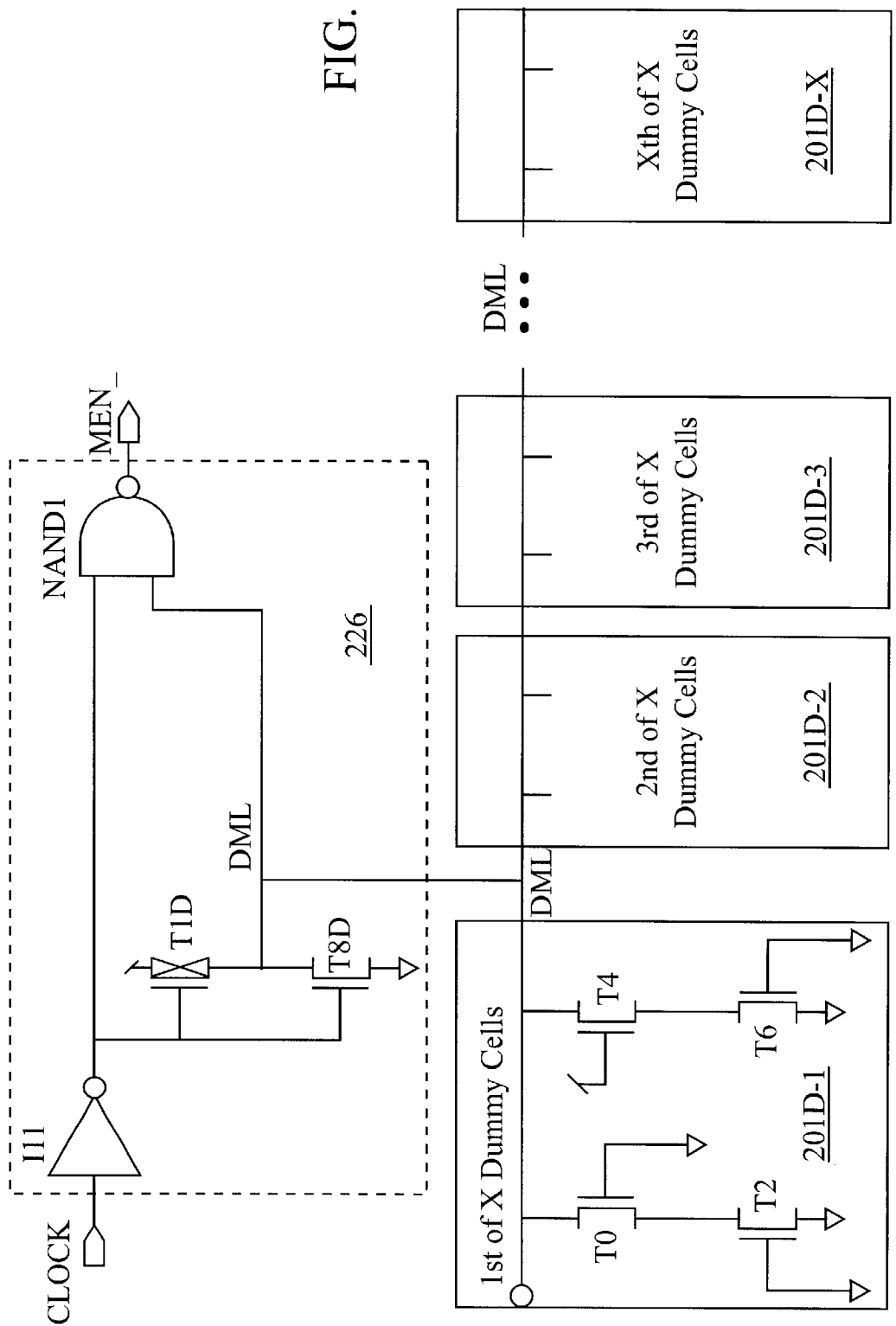
FIG. 4d depicts a circuit diagram of an alternative timing control signal generation circuit including a NAND-gate and a DUMMY MATCH LINE for controlling a plurality of inventive Match Line Controllers in accordance with embodiments of the invention.
Figure 4E:
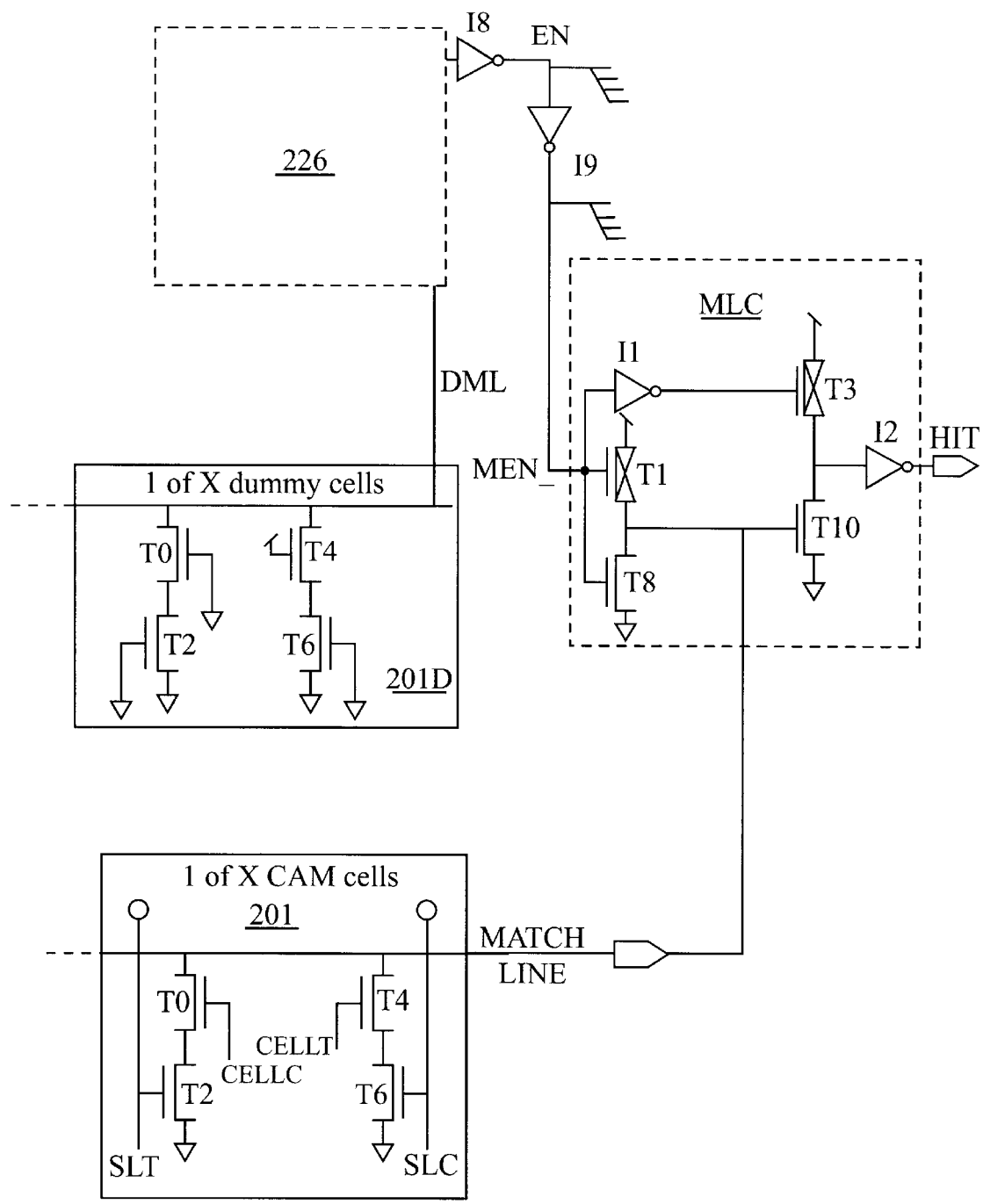
FIG. 4e depicts a circuit diagram of the timing control signal generation circuit of FIG. 4d coupled to a plurality of inventive Match Line Controllers in accordance with embodiments of the invention.

As depicted in FIGS. 4d and 4e, the control signal MEN__ may also be generated from a system clock signal by an alternative NAND-gate based control signal generation circuit 226 that includes a capacitative DUMMY Match Line (DML). The circuit of FIG. 4d is similar to that of circuit 411 of FIG. 4b except that the duration of the Match-Detection Period (i.e., delay period $t_2$ as depicted in FIG. 4c) is characterized instead by the rise-time of the capacitative Dummy Match Line pre-charged Low (by T8D) and then pulled up by pull-up transistor T1D, wherein each transistor (i.e., T1D and T8D) is sized the same or similar to corresponding transistors (i.e., T1 and T8) of the real Match Line Controller (MCL). The Dummy Match Line is coupled to a plurality of Dummy CAM cells 201D, each of which is adapted to contribute to the Dummy Match Line the same capacitance that a CAM cell in a real MATCH-ing CAM entry (i.e., comprised of real CAM cells 201) would contribute to a real Match Line. In other words, the plurality of Dummy CAM cells 201D coupled to the Dummy Match Line DML emulate a real CAM entry containing data word that MATCH-es a comparand asserted to the CAM entry via the Search Lines.

In an embodiment of the invention wherein the DML is coupled to X Dummy CAM cells, the internal XNOR-gate of each Dummy CAM cell is tied in such a manner as to give the worst case (i.e., highest possible) capacitive load of a CAM array having a data pattern that matches. The DML will therefore rise at a rate equal to the slowest possible Match Line of MATCH-ing entries, thus insuring that the Match Detection Period is long enough for a MATCH-ing entry on a real Match Line to be reliably detected and reported as a HIT output from the real MLC. Because the real and dummy Match Line circuits may be made on the same semiconductor chip, they are presumably subject to the same manufacturing and environmental conditions, and the Dummy Match Line may therefore be expected to have the same capacitance and to perform in a virtually identical manner as a Match Line of a real MATCH-ing entry.

In the circuit 226 of FIG. $4_d$, the timing control signal MEN__ will go to a Low level when the system clock signal CLOCK falls and time $t_1$ has elapsed, where $t_1$ is the propagation delay time through inverter I11. The Low voltage level state of MEN__ continues until the time period $t_2$ elapses. When the time period $t_2$ elapses after the timing control signal MEN__ has gone to a logic Low level, MEN will return to a logic High level. Time period $t_2$ as controlled by the circuit of FIG. 4d is characterized by the time it inherently takes for the capacitative DUMMY Match Line (DML) to rise from its pre-charged Low voltage level to a predetermined Dummy Match-Detection voltage. The Match-Detection Period controlled by the circuit 226 of FIGS. 4d and 4e may be intentionally modified (i.e., shortened or lengthened) in alternative embodiments of the invention by methods including: 1) changing the capacitance of the Dummy Match Line; and/or by 2) changing the parameters of the pull-up transistor T1D; and/or 3) by changing the pre-charge (pre-search) voltage of the Dummy Match Line; and/or 4) by changing the effective Match Detection Voltage that switches the input to the NAND-gate NAND1 that is coupled to the Dummy Match Line, and/or by other methods that would be within the ability of persons skilled in the art. The capacitance of the Dummy Match Line can be modified by modifying the structure of the Dummy Match Line itself, and/or by modifying the structure of any one or more of the Dummy CAM cells coupled to the Dummy Match Line, and/or by adding or omitting one or more Dummy CAM cells, and/or adding or omitting one pass-transistor stack (i.e., one leg of the Match-Line pass-gate) coupled to the Dummy Match Line.

As noted, additional time (delay) may be added to the Match Detection Period (i.e., $t_2$) by adding dummy CAM cells (e.g., adding dummy CAM cell X+1) to the Dummy Match Line thereby increasing the capacitance (and rise-time) of the Dummy Match Line, and/or adding buffers (e.g., adding an even number of inverters) in series with the inverter formed by transistors T1 and T8. Similarly, the Match Detection Period (i.e., $t_2$) may be effectively reduced (or tuned) by omitting or modifying one or more of the X dummy CAM cells from the Dummy Match Line (and/or by omitting one or more of the 2× parallel legs of the XNOR gates coupled to the Dummy Match Line), thereby reducing the capacitance (and rise-time) of the Dummy Match Line.

Other ways to control and refine the duration of the Match-Detection Period (i.e., $t_2$) will be within the ability of persons skilled in the art, such as by adjusting the size of transistor T1D in the circuit 226 of FIG. 4d, etc.. As previously noted, the Match-Detection Period of the control signal MEN generated by the circuit 226 of FIG. 4d may also be modified by altering the Dummy Match-Detection voltage. The Dummy Match-Detection voltage may be set equal to the real Match-Detection Voltage (e.g., $V_{MD}=V_T$) by incorporating the functionality of the real Match-Detection Circuit(210 including equivalents of T3 and T8 and I2) of the real Match Line Controller (MLC) circuit into the NAND-gate NAND1. Alternatively, the Dummy Match-Detection Voltage may be set higher than the real Match-Detection Voltage ($V_{MD}$) and set at approximately equal to one half of the supply voltage, to simplify the NAND-gate circuitry and to allow for a larger margin of time (delay) to insure reliable Match-Detection, and the latching of the High HIT signal.

FIG. 4a depicts a timing control signal generation circuit 401 that may be adapted to be used to support clock-asynchronous CAM searches. The signal generation circuit 401 has an input terminal to which the pulsed-High "GO" signal is input. The pulsed-High GO signal is latched High, at output line/node EN by the operation of the combination of the delay line 402 (comprising a series of an odd number of inverters, e.g., I3, I4, I5, I6, I7) and the three-input cross-wired-transistor latching circuit 403 (comprised of transistor stack T9–T18–T16, transistor stack T11–T22–T20 and CMOS inverter I8 which is comprised of a PFET stacked upon an NFET). (The pulsed-high GO input is active for longer than the total propagation delay of the delay line (inverters I3–I7) but shorter than the time delay from GO rising to STOP falling.) The latched-High output EN of the three-input cross-wired-transistor latching circuit 403 is then inverted by inverter I9 to produce the search-enabling Low MEN_ control signal that is distributed to the plurality of Match Line Controllers (MLC) and to a Dummy-Match-Line Controller DMLC. In an embodiment of the invention, all of the elements and the structure of the Dummy Match Line Controller (DMLC) are substantially identical to corresponding elements and structure of a real Match Line Controller fabricated on the same semiconductor chip. The Dummy-Match Line Controller will generate a High Dummy-HIT signal (DHIT) that will pull control signal MEN_ High (thereby ending the Match-Detection Period by disabling the Match-Detection Circuit 210 of the real MLCs) through operation of inverter I12 and the latch-interrupting transistors PFET T9 and NFET T22 within the cross-wired-transistor latching circuit 403.

The three inputs of the cross-wired-transistor latching circuit 403 are activated sequentially: first, the pulsed-High GO signal is input at the gate of transistor T18 turning T18 ON while T16 is ON, thereby asserting a latched-High GO signal at latch-output node EN; second, an inverted time-delayed GO signal is input at the gate of transistor T16, turning OFF T16 and turning OFF the T16–T18 stack at a relatively short time interval after GO has been latched High at latch-output node EN; and last, a STOP signal (derived from the Dummy-HIT,DHIT, signal output from the Dummy-Match Line Controller, DMLC) is input at the gates of latch-interrupting transistors PFET T9 and NFET T22 within the cross-wired-transistor latching circuit 403, thereby returning the latch-output node EN to Low, which in turn brings control signal MEN_ High (thereby ending the Match-Detection Period by disabling the Match-Detection Circuit 210 of the real MLCs) through inverter I9. The circuit 401 of FIG. 4a is therefore adapted to generate a search-enabling Low control signal MEN_ shortly after a GO signal is pulsed high, and which may be asynchronous with the system clock. The duration of the Match-Detection Period of the MEN_ control signal generated by the circuit 402 of FIGS. 4a is approximately (not less than) the time interval between the time that node EN latches High and the subsequent time that node EN is returned to Low. Because this time interval of the High-state of node EN is controlled by the effective time-delay within the Dummy-Match Line Controller, (i.e., the delay between the assertion of the search-enabling Low MEN signal and the output of the Dummy-HIT signal), and because the capacitance (and rise time) of the Dummy-Match Line is supposed to be virtually equal to the capacitance (and rise time) of the Match Line of a real MATCH-ing entry, the circuit 401 is adapted to provide a search-enabling Low MEN_ control signal for a Match Detection Period that will be not-less-than the time needed to allow the Match Line of a real MATCH-ing entry to rise to the Match-Detection Voltage (e.g., at T8 and T8D), and that can be not unnecessarily longer than that rise time. The Match-Detection Period controlled by the circuit 401 of FIG. 4a may be intentionally modified (i.e., shortened or lengthened) in alternative embodiments of the invention by methods including the same methods that were described above as methods for modifying the Match-Detection Period controlled by the circuit 226 of FIG. 4c. The Match-Detection Period controlled by the circuit 401 of FIG. 4a may additionally be affected by the capacitance of the line carrying signal MEN_, and by the propagation delay of the feedback path of the signal DHIT back to and through inverter I9.

Figure 5:
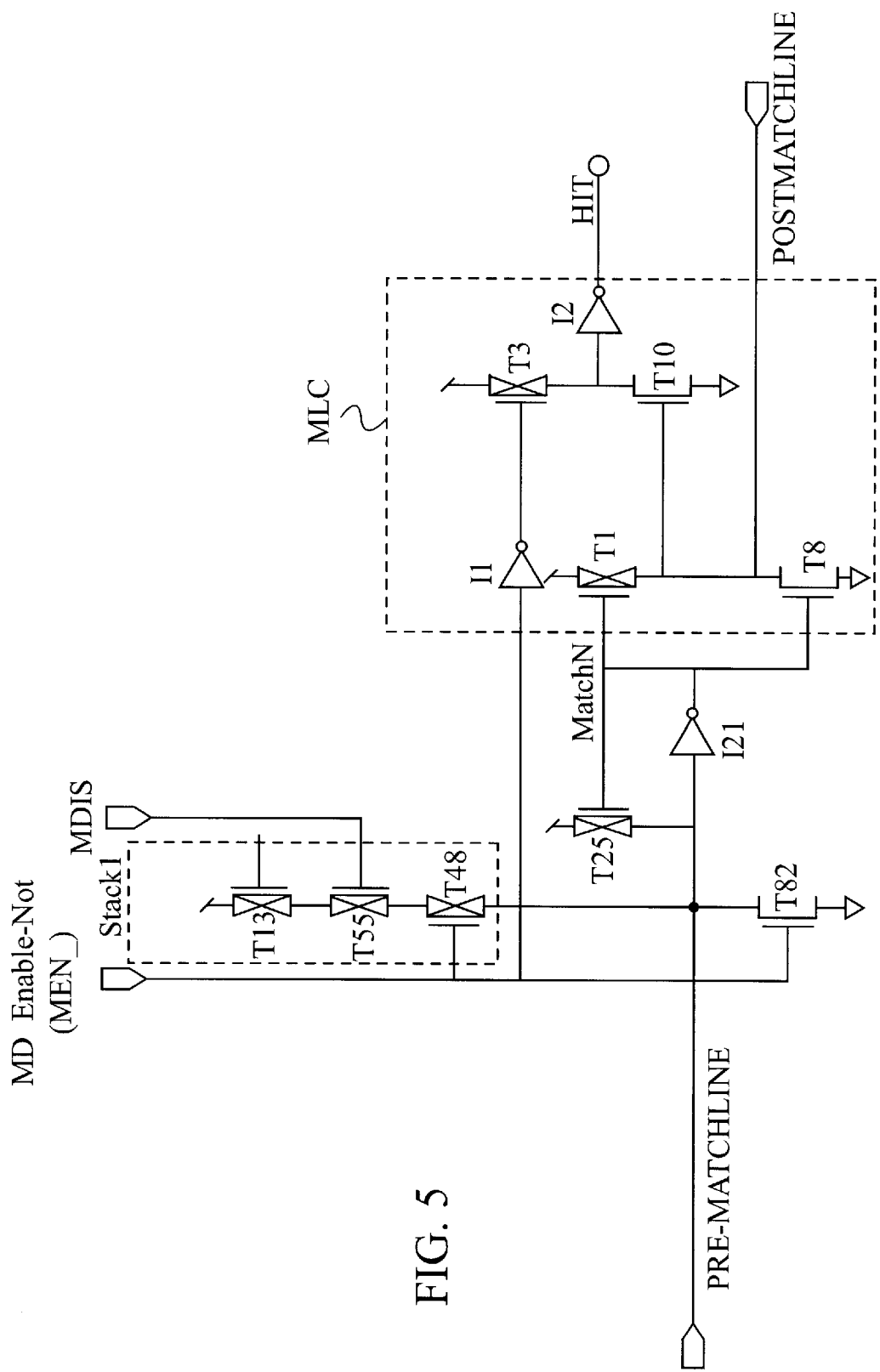
FIG. 5 depicts a circuit diagram of an alternative embodiment of the inventive Match Line Controller of FIG. 2a wherein an inventive PRE-MATCH LINE circuit enables the CAM Search of the POST-MATCH LINE portion of the CAM entry.
Figure 6:
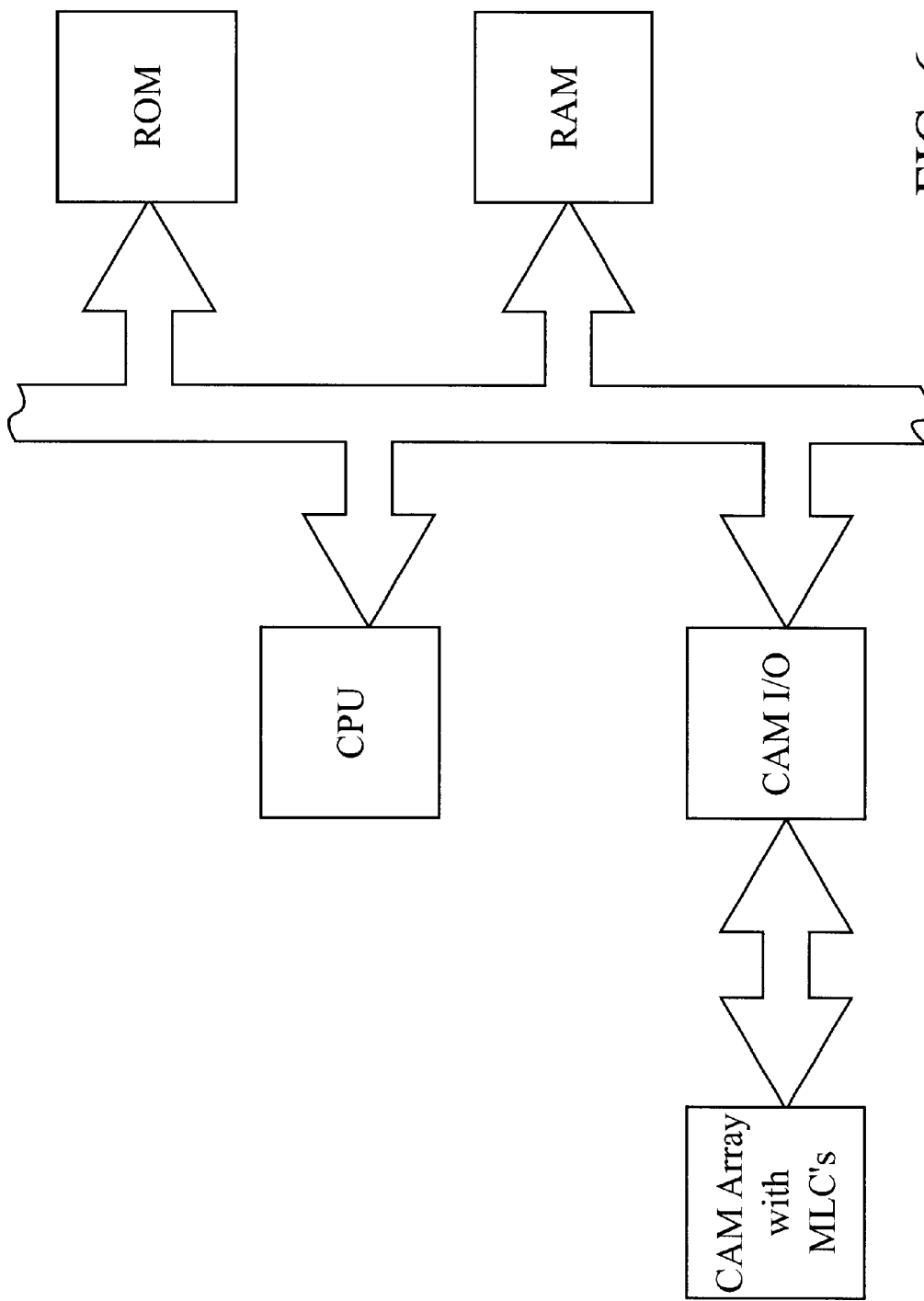
FIG. 6 depicts a representative digital system including a CAM array operated in accordance with an embodiment of the present invention.

FIG. 5 depicts another embodiment of the invention, wherein a Match Line Controller controls only a subset of the CAM cells of the CAM entry, while another Match Line Controller controls the remainder of the CAM cells of the CAM entry. For example, given a 64-bit word wide (X=64) CAM entry, a set of 4 Pre-Select bits (i.e., 4 CAM cells) are coupled to a separate Pre-Match Line, while the other 60 bits (i.e., 60 CAM cells) are coupled to a Post-Match Line. In this embodiment, the 4 Pre-Select bits of all entries are compared to the corresponding 4 bits of the comparand, and only those entries having MATCH-ing Pre-Select bits will be subject to further comparison with the comparand. Statistically, using 4 Pre-Select bits, it may only be necessary to perform further comparison on one-sixteenth of entries in the average CAM search. And, thus, statistically, fifteen-sixteenths of the energy that would otherwise have been expended to search the remaining 60 bits of all the CAM entries of the array, may be conserved during the lifetime of the CAM array.

In operation, MEN_ starts out High and MDIS starts out Low. Therefore PRE-MATCHLINE and POST-MATCHLINE are Low; FLOAT is precharged High; and output HIT is Low. At the beginning of the CAM Search Period, MEN_ falls to Low, and the weak-PFET stack STACK1 (e.g., comprising T13+T55+T48) begins to pull PRE-MATCHLINE up towards $V_{DD}$.

If the four Pre-Select bits of an entry mismatch against the corresponding bits of the comparand., PRE-MATCHLINE rises no higher than a maximum asymptotic voltage level which is (by careful sizing of the PFET stack STACK1), well below the NFET $V_T$, and no further comparisons are performed in that CAM entry. If the four Pre-Select bits of an entry match with the corresponding bits of the comparand, PRE-MATCHLINE rises quickly (because of the small capacitance of the PRE-MATCHLINE due to the small number of CAM cell's loading the PRE-MATCHLINE), and the voltage on node MATCHN falls, and the keeper-transistor T25 locks ON. (Meanwhile, the Pre-Select portion of the Dummy CAM array coupled to a Dummy-PRE-MATCHLINE has generated the same result; the Dummy-MATCHN signal falls and is buffered into MEN_, which shuts OFF T82 and stops the through-current on the mis-matched PRE-MATCHLINEs, saving power.) Meanwhile, MATCHN, having fallen in the MATCH-ing entries, turns on weak PFET pull-up T1 (of the Match Line Controller MLC that controls the POST-MATCHLINE), which attempts to pull up POST MATCHLINE, in exactly the same manner as described with respect to the Match Line of the circuit depicted in FIG. 2a. Thus, if the entire CAM entry is a match, FLOAT will discharge Low and HIT will rise High.

While the invention has been particularly shown and described with reference to exemplary embodiments thereof, it will be understood by those skilled in the art that the foregoing and other variations in form, arrangement and details may be made therein without departing from the spirit and scope of the invention disclosed herein.

We claim:

1. A content addressable memory (CAM) device comprising:

an entry including:
      a plurality of CAM cells each coupled to a Match Line Pass-Gate having a plurality of legs;
      a Match Line having a Match Line Voltage, and being coupled to the Match Line Pass-Gate, such that when any leg of the Match Line Pass-Gate is conducting the Match Line is coupled to a Low voltage level;
      a Match-Detection Circuit including a Field Effect Transistor coupled to the Match Line and adapted to detect a MATCH-ing entry;
      wherein the MATCH-ing entry is characterized by the rise of the Match Line Voltage from a Low voltage level to a Match-Detection voltage within a Match-Detection Period;
      and wherein a MISS-ing entry is characterized by one or more legs of the Match Line Pass-Gate being conducting during the Match-Detection Period.

2. The device of claim 1, wherein the Match-Detection Circuit is adapted to detect a MATCH-ing entry even if the Match Line Voltage never rises to ONE-HALF of the Supply Voltage.

3. The device of claim 1, wherein the Match-Detection Circuit is adapted to detect a MATCH-ing entry when the Match Line Voltage rises to the conducting Threshold Voltage of a Field Effect Transistor (FET).

4. The device of claim 1, wherein the Match-Detection Circuit is adapted to output a HIT signal when the Match Line Voltage ($V_{ML}$) is equal to or more than the conducting Threshold Voltage of the Field Effect Transistor (FET) and less than ONE-HALF of the Supply Voltage.

5. The device of claim 4, wherein the Field Effect Transistor is an NFET.

6. The device of claim 1, wherein the Match-Detection Circuit is adapted to detect a MATCH-ing entry when the Match Line Voltage ($V_{ML}$) is equal to the conducting Threshold Voltage of the Field Effect Transistor (FET), and wherein the FET is an NFET.

7. The device of claim 3, wherein the Match-Detection Circuit is adapted to output a HIT signal when the Match Line Voltage ($V_{ML}$) is between about 100 percent and about 166 percent of the conducting Threshold Voltage of the FET.

8. The device of claim 1, wherein the Match-Detection Circuit is coupled to a control signal generation circuit that generates a control signal, wherein the control signal is adapted to enable the Match-Detection Circuit at the beginning of the Match-Detection Period, and is further adapted to turn off a through-current in a MISSING-entry at the end of the Match-Detection Period.

9. The device of claim 8, wherein the Match-Detection Period is less than twice the inherent period of time it takes for the Match Line Voltage of a MATCH-ing entry to rise from the Low voltage level to ONE-HALF of the Supply Voltage.

10. The device of claim 8, wherein the Match-Detection Period is less than the inherent period of time it takes for the Match Line Voltage of a MATCH-ing entry to rise from the Low voltage level to a High voltage level equal to about 90 percent of the Supply Voltage.

11. The device of claim 8, wherein the Match-Detection Period is less than four times the inherent period of time it takes for the Match Line Voltage of a MATCH-ing entry to rise from the Low voltage level to a High voltage level equal to about 90 percent of the Supply Voltage.

12. The device of claim 8, wherein the Match-Detection Period is not greater than the inherent period of time it takes for the Match Line Voltage of a MATCH-ing entry to rise from the Low voltage level to a voltage level equal to about 150 percent of the conducting Threshold Voltage of the FET.

13. The device of claim 8, wherein the Match-Detection Period is not greater than the inherent period of time it takes for the Match Line Voltage of MATCH-ing entry to rise from the Low voltage level to a voltage level equal to about 120 percent of the conducting Threshold Voltage of the FET.

14. The device of claim 8, wherein the Match-Detection Period is not greater than the inherent period of time it takes for the HIT output to be latched High.

15. The device of claim 8, wherein the Match-Detection Period is less than the inherent period of time it takes for the Match Line Voltage of a MISS-ing entry to rise from the Low voltage level to the conducting Threshold Voltage of the FET.

16. The device of claim 9, wherein the end of the Match-Detection Period is characterized by the rise of a voltage on a Dummy Match Line to the Match Detection Voltage.

* * * * *